United States Patent
Zhong et al.

(10) Patent No.: US 8,686,534 B2
(45) Date of Patent: Apr. 1, 2014

(54) TRENCH ISOLATION STRUCTURE AND METHOD FOR FORMING THE SAME

(75) Inventors: Huicai Zhong, Beijing (CN); Chao Zhao, Kessel-lo (BE); Qingqing Liang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/145,301

(22) PCT Filed: Apr. 22, 2011

(86) PCT No.: PCT/CN2011/073180
§ 371 (c)(1),
(2), (4) Date: Jul. 19, 2011

(87) PCT Pub. No.: WO2012/068825
PCT Pub. Date: May 31, 2012

(65) Prior Publication Data
US 2013/0228893 A1   Sep. 5, 2013

(30) Foreign Application Priority Data
Nov. 23, 2010 (CN) .......................... 2010 1 0557395

(51) Int. Cl.
*H01L 29/00* (2006.01)
*H01L 21/76* (2006.01)

(52) U.S. Cl.
USPC .............. 257/506; 257/510; 257/E21.546; 257/E29.02; 438/424; 438/435

(58) Field of Classification Search
USPC ......... 438/424, 435; 257/506, 510, E21.546, 257/E29.02
See application file for complete search history.

(56) References Cited

U.S. PATENT DOCUMENTS

| | | | | |
|---|---|---|---|---|
| 4,307,180 A | * | 12/1981 | Pogge | 438/424 |
| 4,631,803 A | * | 12/1986 | Hunter et al. | 438/426 |
| 5,443,661 A | * | 8/1995 | Oguro et al. | 148/33.5 |
| 5,747,866 A | * | 5/1998 | Ho et al. | 257/506 |
| 7,138,319 B2 | | 11/2006 | Chen et al. | |
| 2007/0281493 A1 | | 12/2007 | Fucsko et al. | |
| 2008/0237604 A1 | * | 10/2008 | Alshareef et al. | 257/69 |
| 2009/0212337 A1 | | 8/2009 | Murakoshi et al. | |
| 2011/0108921 A1 | * | 5/2011 | Kanakasabapathy et al. | 257/369 |

FOREIGN PATENT DOCUMENTS

CN     101728291 A     6/2010

OTHER PUBLICATIONS

Stanley Wolf, Silicon Processing for the VSLI Era vol. 2 Lattice Press 1990 pp. 52, 54-55.*
International Search Report and Written Opinion for PCT/CN2011/073180 (in Chinese), mailed Aug. 18, 2011; ISA/CN.
First Chinese Office Action regarding Application No. 201010557395.7, dated Jul. 16, 2013. Partial translation provided by Unitalen Attorneys at Law.

* cited by examiner

*Primary Examiner* — David S Blum
(74) *Attorney, Agent, or Firm* — Harness, Dickey & Pierce, P.L.C.

(57) ABSTRACT

A trench isolation structure and a method of forming the same are provided. The trench isolation structure includes: a semiconductor substrate, and trenches formed in the semiconductor substrate and filled with a dielectric layer, where the material of the dielectric layer is a crystalline material. By using the present invention, the size of the divot can be reduced, and device performances can be improved.

22 Claims, 5 Drawing Sheets

TRENCH ISOLATION STRUCTURE AND METHOD FOR FORMING THE SAME

CROSS-REFERENCE TO RELATED APPLICATION

This application is a Section 371 national stage application of, and claims priority to, International Application No. PCT/CN2011/073180 filed on Apr. 22, 2011, which claims priority to Chinese Application No. 201010557395.7 filed on Nov. 23, 2010. Both the International Application and the Chinese Application are incorporated herein by reference in their entireties.

FIELD OF THE INVENTION

The present invention relates to the field of semiconductor fabrication, and in particular, to a trench isolation structure and a method for forming the same.

BACKGROUND OF THE INVENTION

In the deep-submicron era of semiconductor technology, shallow trench isolation (STI) is widely used for the isolation between active areas of semiconductor devices such as metal-oxide-semiconductor (MOS) transistors. Generally, the STI process includes: forming a shallow trench in the semiconductor substrate by, e.g., etching, for the isolation between the active areas in the semiconductor substrate; then, filling the shallow trench with dielectric material such that the dielectric fills up the shallow trench and extends to cover the surface of the semiconductor substrate; and finally, planarizing the dielectric such that the surface of the semiconductor substrate is exposed. The planarization method may be chemical-mechanical polishing. When the STIs are formed, semiconductor devices such as MOS transistors can be formed on the active areas between the STIs.

As shown in FIG. 1, conventional STI includes: a semiconductor substrate 10; shallow trenches formed in the semiconductor substrate 10, which are filled with a dielectric layer 11; and active areas in the semiconductor substrate 10 between the shallow trenches, where semiconductor devices, such as MOS transistors each with a gate, a source, and a drain, are formed. However, due to the planarization process and subsequent procedures such as cleaning, in the conventional STI structure, a recess 12 known as "divot" may be induced between the surface of the dielectric layer 11 and the adjacent surface of the semiconductor substrate 10. The divot may cause problems such as leakage and device performance degradation. Moreover, as the sizes of devices shrink, the divot's relative size compared with the device formed between the STI becomes larger, resulting in even more device performance degradation.

SUMMARY OF THE INVENTION

The problem to be solved by the present invention is to provide a trench isolation structure and a method of forming the same to reduce the impact of the divot on device performance.

To solve the above problems, according to the present invention, it is provided a trench isolation structure, including:
a semiconductor substrate; and
trenches, which are formed on the semiconductor substrate and filled with a dielectric layer, wherein, the material of the dielectric layer is a crystalline material.

Optionally, the semiconductor substrate is a silicon substrate, a silicon-germanium substrate, a III-V compound substrate, a silicon carbide substrate, a silicon-on-insulator structure, or a diamond substrate, or a multi-layer structure comprising any one or more layers selected from the group consisted of a silicon layer, a silicon-germanium layer, a III-V compound layer, and a silicon carbide layer.

Optionally, the material of the dielectric layer is crystalline gadolinium oxide ($Gd_2O_3$) or crystalline neodymium oxide ($Nd_2O_3$).

Optionally, the dielectric layer is ion-doped such that the dielectric layer has a lattice constant larger or smaller than a lattice constant of the semiconductor substrate.

Optionally, a P-type Metal Oxide Semiconductor (PMOS) transistor is formed on the semiconductor substrate between the trenches, the trenches are on respective sides of the PMOS transistor in the channel length direction, and the lattice constant of the dielectric layer is larger than the lattice constant of the semiconductor substrate.

Optionally, an N-type Metal Oxide Semiconductor (NMOS) transistor is formed on the semiconductor substrate between the trenches, the trenches are on respective sides of the NMOS transistor in the channel length direction, and the lattice constant of the dielectric layer is smaller than the lattice constant of the semiconductor substrate.

Optionally, the dielectric layer has a multi-layer structure including at least two layers.

Optionally, the dielectric layer has a surface higher than a surface of the semiconductor substrate.

Optionally, the surface of the dielectric layer is higher than the surface of the semiconductor substrate by 20 nm to 30 nm.

Optionally, the trenches have sidewalls including an upper sidewall and a lower sidewall which are connected with each other, and both the upper sidewall and the lower sidewall are in the {111} lattice plane of the semiconductor substrate.

To solve the above problems, according to the present invention, it is provided a method for forming a trench isolation structure, including:
providing a semiconductor substrate;
forming trenches on the semiconductor substrate; and
forming a dielectric layer in the trenches, wherein the material of the dielectric layer is a crystalline material.

Optionally, the semiconductor substrate is a silicon substrate, a silicon-germanium substrate, a III-V compound substrate, a silicon carbide substrate, a silicon-on-insulator structure, or a diamond substrate, or a multi-layer structure comprising any one or more layers selected from the group consisted of a silicon layer, a silicon-germanium layer, a III-V compound layer, and a silicon carbide layer.

Optionally, the material of the dielectric layer is crystalline gadolinium oxide or crystalline neodymium oxide.

Optionally, the forming of the dielectric layer is by epitaxial growth or solid-phase epitaxial growth.

Optionally, impurity ions are introduced in the epitaxial growth or solid-phase epitaxial growth such that the dielectric layer has a lattice constant larger or smaller than a lattice constant of the semiconductor substrate.

Optionally, the lattice constant of the dielectric layer is larger than the lattice constant of the semiconductor substrate, and the method further includes: forming a PMOS transistor on the semiconductor substrate between the trenches, with the trenches being on respective sides of the PMOS transistor in the channel length direction.

Optionally, the lattice constant of the dielectric layer is smaller than the lattice constant of the semiconductor substrate, and the method further includes: forming an NMOS transistor on the semiconductor substrate between the trenches, with the trenches being on respective sides of the NMOS transistor in the channel length direction.

Optionally, forming the dielectric layer in the trenches includes: forming at least two dielectric layers in the trenches, the dielectric being a crystalline material.

Optionally, forming the trenches on the semiconductor substrate includes:

forming a pad layer and a hard-mask layer in this order on the semiconductor substrate;

etching the hard-mask layer and the pad layer to define a pattern of the trenches; and etching the semiconductor substrate by using the hard-mask layer as a mask, so as to form the trenches.

Optionally, forming the dielectric layer in the trenches includes:

forming the dielectric layer in the trenches, wherein the dielectric layer having a surface as high as a surface of the hard-mask layer; and removing the pad layer and the hard-mask layer.

Optionally, the pad layer and the hard-mask layer have a total thickness ranging from 20 nm to 30 nm.

Optionally, the method further includes: after the formation of the trenches: wet-etching sidewalls of the trenches.

Compared with the prior art, the present invention has the following advantages.

For the trench isolation structure according to the present technical solution, the trenches are filled with a crystalline dielectric layer, so that the interface between the dielectric layer and the semiconductor substrate is tighter, which may reduce the size of the divot, thus reduce the impact of the divot on semiconductor device performances.

Furthermore, according to the present technical solution, the upper surface of the dielectric layer filled in the trenches may be higher than the surface of the semiconductor substrate, which may further reduce the size of the divot and improve semiconductor device performances.

Furthermore, according to the present technical solution, impurity ions may be introduced into the crystalline dielectric layer in the trenches so that the lattice constant of the dielectric layer may be tuned to have larger or smaller than the lattice constant of the semiconductor substrate, so as to produce compressive stress or tensile stress within the dielectrics and thus improve the performances of a PMOS transistor or an NMOS transistor.

DETAILED DESCRIPTION OF THE INVENTION

In a conventional STI structure, there will be a divot between the surface of the dielectric layer filled in the shallow trench and the surface of the semiconductor substrate, causing leakage, and degrading semiconductor device performances.

In a conventional STI structure, the dielectric layer is formed of a non-crystalline material, e.g., silicon oxide, or silicon nitride. The inventors found that, due to the fact that the semiconductor substrate is formed of a crystalline material, the interface between the non-crystalline dielectric layer and the crystalline semiconductor substrate is not tight, and a divot at the joint between the non-crystalline material and the crystalline material may be induced during planarization and subsequent cleaning procedures, which causes leakage current and degrades semiconductor device performances.

In the trench isolation structure according to the present technical solution, the trenches are filled with a crystalline dielectric layer. The crystal lattice structure of crystalline dielectric materials makes interface of two crystalline materials easier, so the interface between the dielectric layer and the semiconductor substrate is tighter, which may reduce the size of the divot, and reduce the impact of the divot on semiconductor device performances.

Moreover, according to the present technical solution, impurity ions are introduced into the dielectric layer in the trenches such that the lattice constant of the dielectric layer is larger or smaller than the lattice constant of the semiconductor substrate, thus inducing compressive stress or tensile stress within semiconductor substrate and improving the performances of the PMOS transistor and the NMOS transistor, respectively.

Furthermore, according to the present technical solution, the upper surface of the dielectric layer filled in the trenches is higher than the surface of the semiconductor substrate, which may further reduce the size of the divot, and improve semiconductor device performances.

For better understanding of the objective, features and advantages of the present invention, the embodiments of the invention will be described hereinafter in conjunction with the accompanying drawings.

Details of the embodiments of the invention are described below for descriptive purpose. It should be noted that the invention can be implemented other than the embodiments disclosed herein, and modifications can be made by those skilled in the art without deviation from the scope of the invention. Hence, the scope of the invention is not limited to the embodiments disclosed herein.

Figure 1:
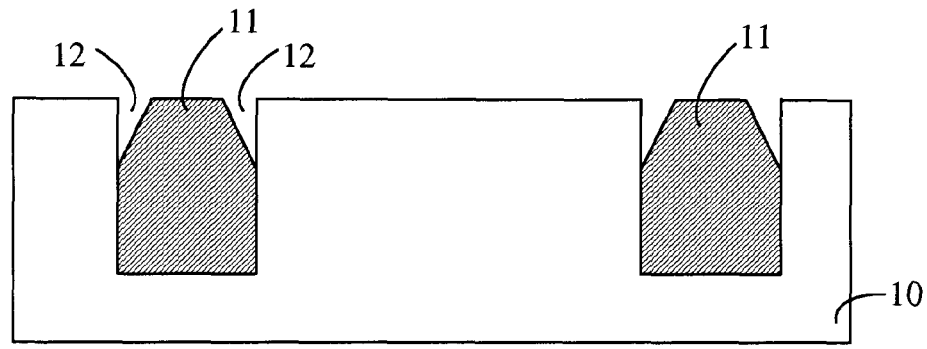
FIG. 1 is a cross-sectional view of conventional STI.
Figure 2:
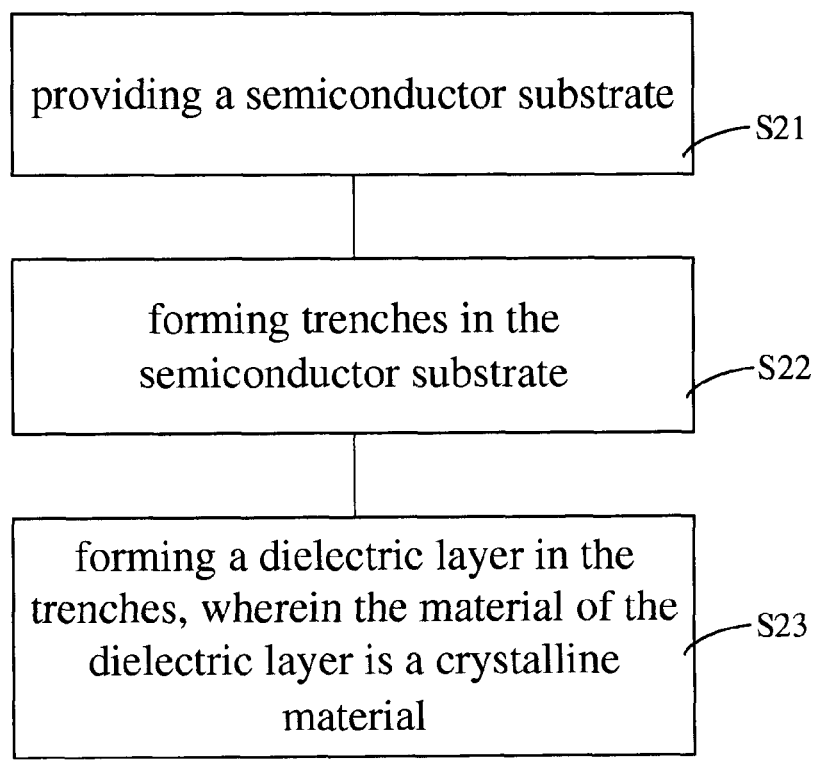
FIG. 2 is a flow chart of a method for forming a trench isolation structure according to an embodiment of the present invention.

FIG. 2 is a flow chart of a method for forming a trench isolation structure according to a first embodiment of the present invention. As shown in FIG. 2, the method includes:

step S21: providing a semiconductor substrate;

step S22: forming trenches on the semiconductor substrate; and step S23: forming a dielectric layer in the trenches, wherein the material of the dielectric layer is a crystalline material.

FIGS. 3-8 illustrate a method for forming a trench isolation structure according to a first embodiment of the present invention with sectional views of intermediate structures. The embodiment is described below with reference to FIGS. 2 and 3-8.

Figure 3:
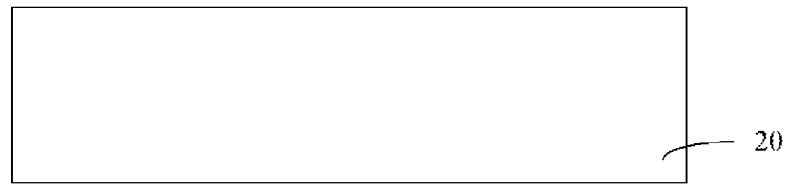
FIG. 3 to FIG. 9 illustrates a method for forming a trench isolation structure according to a first embodiment of the present invention with a cross-sectional view of an intermediate structure.

With reference to FIGS. 2 and 3, step S21 is performed: providing a semiconductor substrate. In particular, a semiconductor substrate 20 is provided, and the semiconductor substrate 20 may be a silicon substrate, a silicon-germanium substrate, a III-V compound substrate (e.g., gallium arsenide, indium phosphide, or gallium nitride), a silicon carbide substrate, a silicon-on-insulator substrate, a diamond substrate, or a multi-layer structure substrate comprising any one or more layers selected from the group consisted of a silicon layer, a silicon-germanium layer, a III-V compound layer, and a silicon carbide layer. In this embodiment, the semiconductor substrate 20 is a silicon substrate.

With reference to FIGS. 2 and 4-6, step S22 is performed: forming trenches on the semiconductor substrate.

Figure 4:
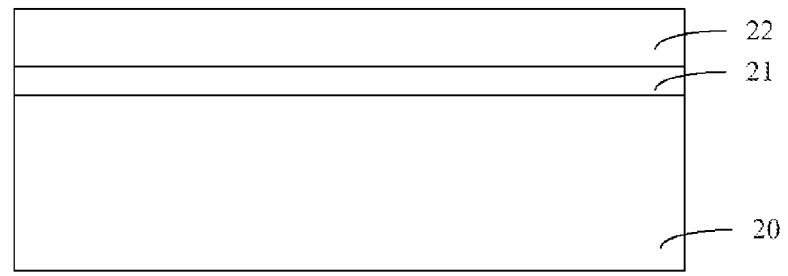

Firstly, with reference to FIG. 4, a pad layer 21 and a hard-mask layer 22 are formed on the semiconductor layer 20. The pad layer 21 may be formed of silicon oxide, and the hard-mask layer 22 may be formed of silicon nitride.

Figure 5:
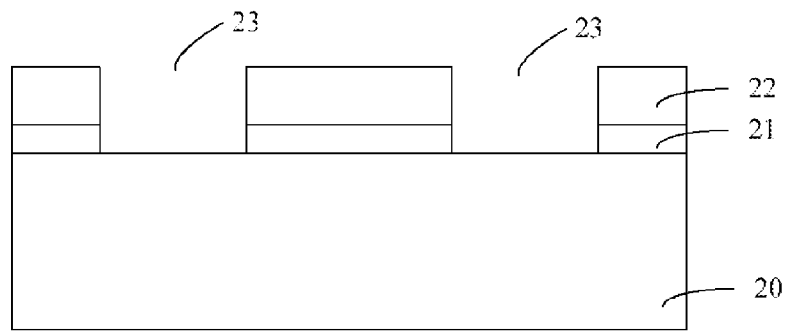

Then, with reference to FIG. 5, the pad layer 21 and the hard-mask layer 22 are etched to define a pattern of trenches 23. The etching may include: forming a photo resist layer (not shown) on the hard-mask layer 22, patterning the photo resist layer to define the pattern of the trenches 23; then, etching the pad layer 21 and the hard-mask layer 22 by using the patterned photo resist layer as a mask so as to transfer the pattern of the trenches 23 to the hard-mask layer 22 and the pad layer 21; and, removing the photo resist layer by, e.g., ashing.

Figure 6:
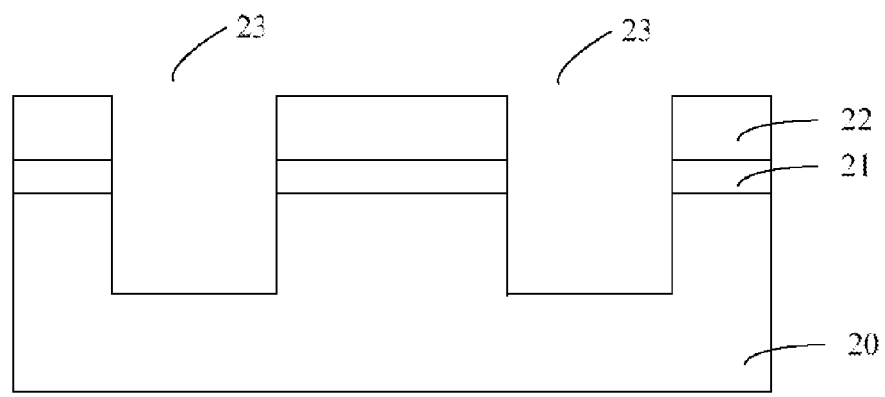

Then, with reference to FIG. 6, the semiconductor layer 20 is etched by using the hard-mask layer as a mask to form the trenches 23. The etching method may be anisotropic dry-etching. Step S22 may further include: after forming the trenches 23 by dry-etching, wet-etching the sidewalls of the trenches 23 using a tetramethylammonium hydroxide (TMAH) or potassium hydroxide (KOH) solution, so that the sidewalls of a trench 23 include an upper sidewall and a lower sidewall connected with each other, and both the upper sidewall and the lower sidewall are in a {111} lattice plane of the semiconductor substrate 20, i.e. the sidewalls of the trench 23 form a "diamond shape".

Figure 7:
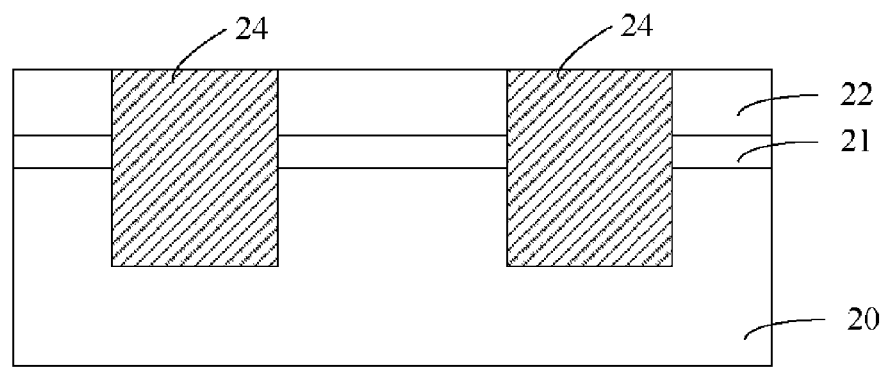
Figure 8:
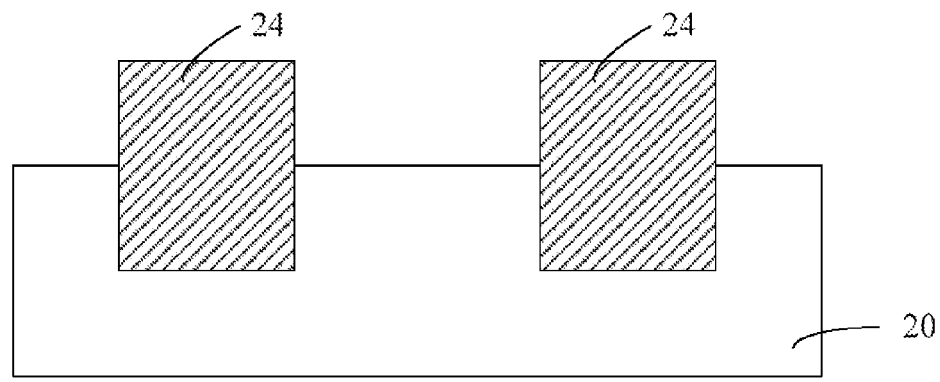

With reference to FIGS. 2, 7, and 8, step S23 is performed: forming a dielectric layer in the trenches, wherein the material of the dielectric layer is a crystalline material.

Firstly, with reference to FIG. 7, a dielectric layer 24 is formed in the trenches by epitaxial growth, solid-phase epitaxial growth, or other methods known in the art, such that the surface of the dielectric layer 24 is as high as the surface of the hard-mask layer 22. The dielectric layer 24 is comprised of a crystalline material, e.g., crystalline gadolinium oxide, crystalline neodymium oxide, or other crystalline dielectrics known in the art. In other embodiments, the dielectric layer 24 may be a multi-layer structure comprising at least two dielectric layers which are sequentially formed in the trenches, with each of the dielectrics being a crystalline material.

During the formation of the dielectric layer 24, impurity ions may be introduced into the dielectric layer 24. For example, impurity ions may be introduced during epitaxial growth, and the lattice constant of the impurity ion doped dielectrics may be larger or smaller than the lattice constant of the semiconductor substrate 20. In particular, depending on the type of the semiconductor device formed eventually, for a PMOS transistor, the impurity ions are introduced so that the lattice constant of the dielectric layer 24 becomes larger than the lattice constant of the semiconductor substrate 20, thereby inducing a comprehensive stress in the direction of the channel length and improving the performances of the PMOS transistor; for an NMOS transistor, the impurity ions are introduced so that the lattice constant of the dielectric layer 24 becomes smaller than the lattice constant of the semiconductor substrate 20, thereby inducing a tensile stress in the direction of the channel length and improving the performances of the NMOS transistor. Moreover, with a dielectric layer 24 of a multi-layer structure, transitional match between the lattice constants of respective layers can be achieved, thereby facilitating induced stress.

With reference to FIG. 8, the pad layer and the hard-mask layer are removed so that the surface of the semiconductor substrate 20 is exposed. In this embodiment, the total thickness of the pad layer and the hard-mask layer may be 20 nm to 30 nm, so the surface of the dielectric layer 24 may be higher than the surface of the semiconductor substrate 20, and the height difference is equal to the total thickness of the pad layer and the hard-mask layer, i.e., the upper surface of the dielectric layer 24 is higher than the surface of the semiconductor substrate by 20 nm to 30 nm. As the dielectric layer 24 is formed of a crystalline material, the interface between the dielectric layer 24 and the semiconductor substrate 20 is tight, thereby reducing the size of the divot between the dielectric layer 24 and the semiconductor substrate 20. Moreover, as the surface of the dielectric layer 24 is higher than the surface of the semiconductor substrate 20 in this embodiment, the direct impact by planarization and cleaning on the interface is reduced, which may further reduce the size of the divot and improve semiconductor device performances. Of course, in other embodiments, the dielectric layer 24 may be planarized such that the surface of the dielectric layer 24 is flush with the surface of the semiconductor substrate 20.

Figure 9:
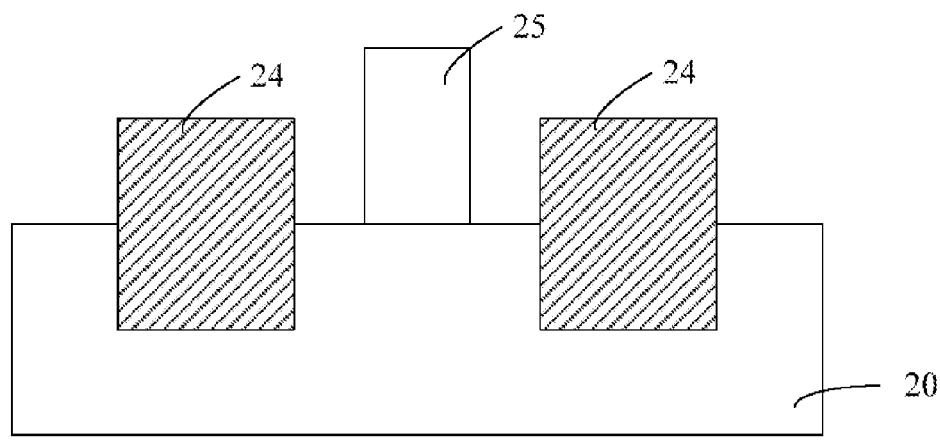

Then, with reference to FIG. 9, a MOS transistor is formed on the semiconductor substrate 20 between adjacent trenches. The MOS transistor includes a gate stack 25, and a source and a drain (not shown) in the semiconductor substrate 20 on opposite sides of the gate stack 25. The dielectric layers 24 in the trenches are on both sides of the MOS transistor in the channel length direction. The forming of the MOS transistor should correspond to the foregoing process of introducing impurity ions into the dielectric layer, i.e., for a PMOS transistor, after ion-doping, the lattice constant of the dielectric layer 24 becomes larger than the lattice constant of the semiconductor substrate 20; and for an NMOS transistor, after ion-doping, the lattice constant of the dielectric layer 24 becomes smaller than the lattice constant of the semiconductor substrate 20.

As shown in FIG. 9, the trench isolation structure formed according to the embodiment includes: a semiconductor substrate 20, and trenches formed on the semiconductor substrate 20 and filled with a dielectric layer 24, wherein the material of the dielectric layer is a crystalline material. The surface of the dielectric layer 24 may be higher than or as high as the surface of the semiconductor substrate 20; impurity ions may be introduced into the dielectric layer 24, such that the lattice constant of the dielectric layer is larger or smaller than the lattice constant of the semiconductor substrate. Semiconductor devices such as MOS transistors may be formed on the semiconductor substrate 20 between the trenches.

Figure 10:
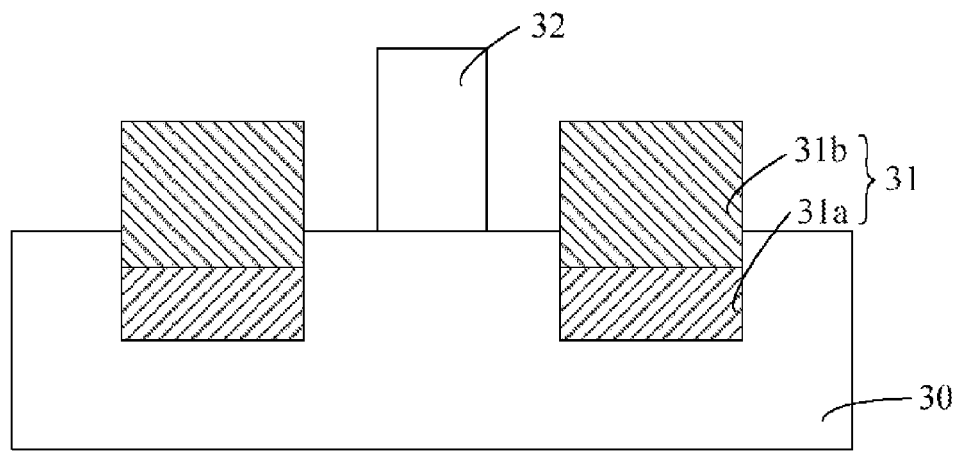
FIG. 10 is a cross-sectional view of a trench isolation structure formed according to a second embodiment of the present invention.

FIG. 10 shows a cross-sectional view of a trench isolation structure formed according to a second embodiment of the present invention. The trench isolation structure includes: a semiconductor substrate 30, and trenches formed on the semiconductor substrate 30 and filled with a dielectric layer 31, wherein the material of the dielectric layer 31 is a crystalline material. In particular, the dielectric layer 31 has a multi-layer structure including a first dielectric layer 31a and a second dielectric layer 31b. Of course, in other embodiments, the dielectric layer 31 may include more dielectric layers, e.g., three layers or four layers. Impurity ions may be introduced into the dielectric layer 31 such that the lattice constant of the dielectric layer 31 is larger or smaller than the lattice constant of the semiconductor substrate 30. A MOS transistor may be formed on the semiconductor substrate 30 between the trenches. The MOS transistor may include a gate stack 32, and a source and a drain in the semiconductor substrate 30 on opposite sides of the gate stack 32. The multi-layer structure of the dielectric layer 31 enables transition between the lattice constants of respective dielectric layers, thereby facilitating the induction of stress and improving carrier mobility and device performances.

Figure 11:
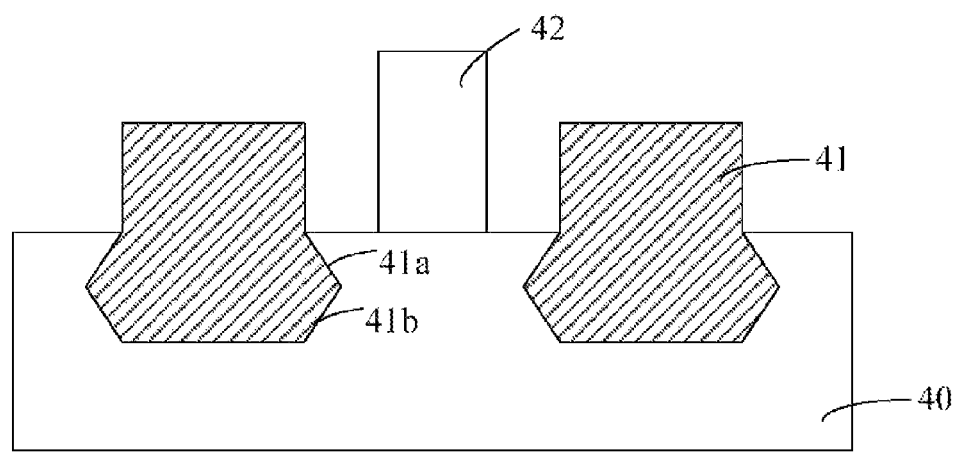
FIG. 11 is a cross-sectional view of a trench isolation structure formed according to a third embodiment of the present invention.

FIG. 11 shows a cross-sectional view of a trench isolation structure formed according to a third embodiment of the present invention. The trench isolation structure includes: a semiconductor substrate 40, and trenches formed on the semiconductor substrate 40 and filled with a dielectric layer 41, wherein the material of the dielectric layer 41 is a crystalline material. In particular, the sidewalls of the trench form a diamond shape and include an upper sidewall 41a and a lower sidewall 41b connected with each other. The upper sidewall 41a and the lower sidewall 41b are in the {111} lattice plane of the semiconductor substrate 40. Impurity ions may be introduced into the dielectric layer 41 such that the lattice constant of the dielectric layer 41 is larger or smaller than the lattice constant of the semiconductor substrate 40. A MOS transistor may be formed on the semiconductor substrate 40 between the trenches. The MOS transistor may include a gate stack 42, and a source and a drain in the semiconductor substrate 40 on opposite sides of the gate stack 42. The diamond-shaped sidewalls of the trenches can help the impurity ion-doped dielectric layer 41 to produce stress in the semiconductor substrate 40 between two adjacent trenches, hence increasing the compressive stress for a PMOS transistor or increasing the tensile stress for a NMOS transistor, depending on the type of the MOS transistor and the lattice constant of the ion-doped dielectric layer 41. In addition, the diamond-shaped sidewalls of the trenches are especially good for improving the compressive stress in embedded silicon-germanium (eSiGe) PMOS transistors, thereby improving carrier mobility and device performance.

To sum up, in a trench isolation structure according to the present technical solution, the trenches are filled with a crystalline dielectric layer, so that the interface between the dielectric layer and the semiconductor substrate is tighter, which may reduce the size of the divot, and reduce the impact of the divot on semiconductor device performances.

Furthermore, according to the present technical solution, the surface of the dielectric layer filled in the trenches is higher than the surface of the semiconductor substrate, which may further reduce the size of the divot and improve semiconductor device performances.

Furthermore, according to the present technical solution, impurity ions may be introduced into the dielectric layer in the trenches such that the lattice constant of the dielectric layer may be larger or smaller than the lattice constant of the semiconductor substrate, producing compressive stress or tensile stress and thus improving the performance of a PMOS transistor or an NMOS transistor, respectively.

Preferred embodiments of the invention are disclosed herein, which should not be interpreted as limiting the scope of the invention. Alternations and modifications can be made to the technical solution of the invention by those skilled based on the technical disclosure herein without deviation from the scope of the invention. Therefore, any alternations, equivalents, and modifications made to the embodiments disclosed herein based on the technical essential of the invention without deviation from the scope of the invention, should fall within the scope of the invention.

What is claimed is:
1. A trench isolation structure, comprising:
a semiconductor substrate; and
trenches, which are formed in the semiconductor substrate and filled with a dielectric layer, wherein,
the material of the dielectric layer is a crystalline material, and the dielectric layer is in direct contact with a sidewall and a bottom of each of the trenches.

2. The trench isolation structure according to claim 1, wherein the semiconductor substrate is a silicon substrate, a silicon-germanium substrate, a III-V compound substrate, a silicon carbide substrate, a silicon-on-insulator structure, a diamond substrate, or a multi-layer structure comprising any one or more layers selected from the group consisted of a silicon layer, a silicon-germanium layer, a III-V compound layer, and a silicon carbide layer.

3. The trench isolation structure according to claim 1, wherein the material of the dielectric layer is crystalline gadolinium oxide or crystalline neodymium oxide.

4. The trench isolation structure according to claim 1, wherein the dielectric layer is ion-doped such that the dielectric layer has a lattice constant larger or smaller than a lattice constant of the semiconductor substrate.

5. The trench isolation structure according to claim 4, wherein a P-type Metal Oxide Semiconductor (PMOS) transistor is formed on the semiconductor substrate between the trenches, the trenches are on respective sides of the PMOS transistor in the channel length direction, and the lattice constant of the dielectric layer is larger than the lattice constant of the semiconductor substrate.

6. The trench isolation structure according to claim 4, wherein an N-type Metal Oxide Semiconductor (NMOS) transistor is formed on the semiconductor substrate between the trenches, the trenches are on respective sides of the NMOS transistor in the channel length direction, and the lattice constant of the dielectric layer is smaller than the lattice constant of the semiconductor substrate.

7. The trench isolation structure according to claim 1, wherein the dielectric layer has a multi-layer structure comprising at least two layers.

8. The trench isolation structure according to claim 1, wherein the dielectric layer has a surface higher than a surface of the semiconductor substrate.

9. The trench isolation structure according to claim 8, wherein the surface of the dielectric layer is higher than the surface of the semiconductor substrate by 20 nm to 30 nm.

10. The trench isolation structure according to claim 1, wherein the trenches have sidewalls comprising an upper sidewall and a lower sidewall which are connected with each other, and both the upper sidewall and the lower sidewall are in the {111} lattice plane of the semiconductor substrate.

11. A method for forming a trench isolation structure, comprising:
providing a semiconductor substrate;
forming trenches in the semiconductor substrate; and
forming a dielectric layer in the trenches, wherein the material of the dielectric layer is a crystalline material, and the dielectric layer is in direct contact with a sidewall and a bottom of each of the trenches.

12. The method for forming a trench isolation structure according to claim 11, wherein the semiconductor substrate is a silicon substrate, a silicon-germanium substrate, a III-V compound substrate, a silicon carbide substrate, a silicon-on-insulator structure, a diamond substrate, or a multi-layer structure comprising any one or more layers selected from the group consisted of a silicon layer, a silicon-germanium layer, a III-V compound layer, and a silicon carbide layer.

13. The method for forming a trench isolation structure according to claim 11, wherein the material of the dielectric layer is crystalline gadolinium oxide or crystalline neodymium oxide.

14. The method for forming a trench isolation structure according to claim 11, wherein the forming of the dielectric layer is by epitaxial growth or solid-phase epitaxial growth.

15. The method for forming a trench isolation structure according to claim 14, wherein impurity ions are introduced in the epitaxial growth or solid-phase epitaxial growth, such that the dielectric layer has a lattice constant larger or smaller than a lattice constant of the semiconductor substrate.

16. The method for forming a trench isolation structure according to claim 15, wherein the lattice constant of the dielectric layer is larger than the lattice constant of the semiconductor substrate, and the method further comprises: forming a PMOS transistor on the semiconductor substrate between the trenches, with the trenches being on respective sides of the PMOS transistor in the channel length direction.

17. The method for forming a trench isolation structure according to claim 15, wherein the lattice constant of the dielectric layer is smaller than the lattice constant of the semiconductor substrate, and the method further comprises: forming an NMOS transistor on the semiconductor substrate between the trenches, with the trenches being on respective sides of the NMOS transistor in the channel length direction.

18. The method for forming a trench isolation structure according to claim 11, wherein forming the dielectric layer in the trenches comprises: forming at least two dielectric layers in the trenches, the dielectric being a crystalline material.

19. The method for forming a trench isolation structure according to claim 11, wherein forming the trenches in the semiconductor substrate comprises:
    forming a pad layer and a hard-mask layer in this order on the semiconductor substrate;
    etching the hard-mask layer and the pad layer to define a pattern of the trenches; and
    etching the semiconductor substrate by using the hard-mask layer as a mask, so as to form the trenches.

20. The method for forming a trench isolation structure according to claim 19, wherein forming the dielectric layer in the trenches comprises:
    forming the dielectric layer in the trenches, wherein the dielectric layer having a surface as high as a surface of the hard-mask layer; and
    removing the pad layer and the hard-mask layer.

21. The method for forming a trench isolation structure according to claim 20, wherein the pad layer and the hard-mask layer have a total thickness ranging from 20 nm to 30 nm.

22. The method for forming a trench isolation structure according to claim 19, wherein the method further comprises: after the formation of the trenches, wet-etching sidewalls of the trenches.

* * * * *